United States Patent [19]

Schilling

[11] Patent Number: 4,847,842
[45] Date of Patent: Jul. 11, 1989

[54] SM CODEC METHOD AND APPARATUS

[75] Inventor: Donald L. Schilling, Sands Point, N.Y.

[73] Assignee: SCS Telecom, Inc., Port Washington, N.Y.

[21] Appl. No.: 122,948

[22] Filed: Nov. 19, 1987

[51] Int. Cl.$^4$ .............................................. G06F 11/10
[52] U.S. Cl. ............................................. 371/37; 371/50
[58] Field of Search ....................... 371/37, 38, 39, 40, 371/49, 50, 51, 35; 375/26, 27, 41, 42, 34

[56] References Cited

U.S. PATENT DOCUMENTS

| | | | |
|---|---|---|---|
| 3,475,724 | 10/1969 | Townsend et al. | 371/37 |
| 3,685,016 | 8/1972 | Eachus . | |
| 3,891,959 | 6/1975 | Tsuji | 371/43 |
| 4,074,229 | 2/1978 | Prey . | |
| 4,201,976 | 5/1980 | Patel . | |
| 4,205,324 | 5/1980 | Patel | 371/50 |
| 4,429,390 | 1/1984 | Sonoda et al. . | |
| 4,435,807 | 3/1984 | Scott et al. | 371/50 |
| 4,532,629 | 7/1985 | Furuya et al. . | |
| 4,553,237 | 11/1985 | Nakamura | 371/43 X |
| 4,598,403 | 7/1986 | Odaka . | |
| 4,716,567 | 12/1987 | Ito et al. | 371/40 |
| 4,719,628 | 1/1988 | Ozaki et al. . | |
| 4,748,628 | 5/1988 | Moriwaki . | |
| 4,750,178 | 6/1988 | Sako et al. . | |
| 4,769,819 | 9/1988 | Matsutani et al. . | |
| 4,796,260 | 1/1989 | Schilling | 371/39 |

Primary Examiner—Jerry Smith
Assistant Examiner—Robert W. Beausoliel
Attorney, Agent, or Firm—David B. Newman, Jr. & Associates

[57] ABSTRACT

A Schilling-Manela encoding codec is provided comprising the steps of storing a block of a data-bit sequence in a memory, calculating parity-check symbols from parity-line symbols having p-bits per symbol along parity lines, and setting the parity-check symbols equal to the modulo-$2^p$ sum of the data symbols. The data-bit sequence and parity-check symbols are transformed from Gray symbols, and the Gray symbols are transformed to modulation symbols. A Schilling-Manela decoding method is provided comprising the steps of storing an encoded data-bit sequence in a memory. The encoded-data-bit sequence includes a parity-check-symbol sequence which is stored in parity-memory cells, and a data-bit sequence which is blocked and stored in information-memory cells. The parity-check symbols and the data symbols along the parity lines in the information-memory cells are found. The count of each composite cell on a composite-error graph traversed by the path of each of the parity lines having an error is incremented and the largest-number cell in the composite-error graph having the largest number is determined. The largest number is compared to a threshold, and a new data symbol is chosen to minimize the count in the largest-number cell and substituted into the stored data-bit sequence.

19 Claims, 8 Drawing Sheets

| 7 | 100 |
| 6 | 101 |
| 5 | 111 |
| 4 | 110 |
| 3 | 010 |
| 2 | 011 |
| 1 | 000 |

SM CODEC METHOD AND APPARATUS

BACKGROUND OF THE INVENTION

This invention relates to forward error correction and detection codes, and more particularly to a forward error correction and detection code method and apparatus having parity check symbols added to information bits symbols and transforming the parity check symbols and information symbols into modulation symbols.

DESCRIPTION OF THE PRIOR ART

A forward error correction (FEC) or detection code has r bits, called parity check bits, added to k information data bits to form an $n=k+r$ bit codeword. The r parity-check bits are added in such a way as to allow a specified number of errors to be detected and/or corrected. The algorithm employed to generate the r parity-check bits for given information bits differs for each code.

Specific forward error correction and detection codes which are well known in the prior art include the Reed-Solomon code, the convolutional code, the Golay code, the Hadamard code, the BCH code and the Hamming code. Each of these codes employs a different algorithm for generating the parity check bits and a different algorithm for recovering the original k data bits or for detecting errors. Texts describing such prior art codes include: H. Taub and D. L. Schilling, *Principles of Communication Systems*, 2 Ed., McGraw-Hill Book Company (1986); S. Lin and D. J. Costello, Jr., *Error Control Coding: Fundamentals and Applications*, Prentice-Hall, Inc., (1983); and R. G. Gallager, *Information Theory and Reliable Communications*, John Wiley and Sons, Inc., (1968).

The forward error correction and detection codes are characterized by their algorithm for encoding and decoding and also by several other properties:

1. Code rate, R: The code rate is the ratio of information data bits, k, to the sum, n, of information data bits and parity check bits, r. Thus, the number of bits in a codeword is $n=k+r$ and the code rate $R=k/n$.

2. Hamming distance: The minimum number of bits by which codewords differ is called the Hamming distance, d. If there are k information bits in an uncoded word, there are $2^k$ possible uncoded information words. For example, if $k=4$ there are 16 possible uncoded words: 0000, ..., 1111. An error in any bit will make the word look like a different one of the $2^k$ words and therefore an error cannot be detected or corrected. However, if r parity check bits are added to the k-bit uncoded word, an n-bit codeword is formed. Hence, there are $2^n$ possible words of which only $2^k$ are used. The selection of the codewords so as to ensure a maximum separation between the codewords is what makes a good code. For example, a Hamming code containing $k=4$ information bits and $n=7$ coded bits has $2^4=16$ codewords of a possible $2^7=128$ words. This is called a (n,k) or (7,4) code of rate $R=4/7$. These codewords are selected so that each codeword differs by 3 bits. Thus, a single error can be detected and corrected while two errors on a codeword cannot be corrected. In the above example, $d=3$.

3. Error Detection: In general, codes can detect $d-1$ errors in a codeword.

4. Error Correction: In general, a code can correct t errors in a codeword, where $$t \leq \frac{d_{min}-1}{2} \text{ or } \frac{d_{min}}{2} - 1, \quad (1)$$

depending on whether d is odd or even, respectively. An approximate upper bound on the number of errors, t, that a code can correct is $$t \leq \frac{r}{4} + \frac{1}{2} \quad (2)$$

5. Erasures: Side information can be used to ascertain that specific bit(s) in a codeword had an increased probability of error. On such occasions those bits can be erased, replacing them by an X rather than by a 1 or 0 in the decoding algorithm. The number of erasures that a code can correct in a codeword is $$E \leq d - 1 \quad (3)$$

If errors and erasures can both occur in a codeword $$d > E + 2t \quad (4)$$

For example, if $d=8$, and there are 1 erasure and 2 errors present, the decoded word will be corrected.

6. Burst Codes: Some codes are designed so that errors can be efficiently corrected if they occur randomly, while other codes are designed so that they can correct a burst, or cluster, of bits where each bit may be in error with high probability. Such codes are called burst correction codes and can correct bursts of length B bits provided that an error-free gap of G bits occurs between bursts. The Reiger bound states that $$G/B \geq \frac{1+R}{1-R} \quad (5)$$

The Reed-Solomon code is an example of a burst correcting code capable of correcting either errors or erasures.

7. Concatenation: Concatenation is encoding data using one code and then the encoded data again is encoded using a second code. A reason for using concatenation is that one code can correct random errors and when failing will generate a burst of errors which the second code can correct. A convolutional code frequently is concatenated with a Reed-Solomon code.

Coding increases the bit rate by adding redundancy. Thus, a code having a rate $R=k/n$ where k is number of information data bits and n is the number of bits in the codeword, results in an increased transmission rate $f_n$ and bandwidth B. In a QPSK system, the bandwidth $B_{QPSK}=f_n$. One can decrease this bandwidth by employing M-ary PSK. Such a bandwidth decrease, however, results in an increase in the undecoded symbol error rate. For MPSK, $$P_e = \text{erfc}[(E_b/\eta) N \sin^2 \pi/2^N]^{1/2}$$

where $E_b/\eta$ is the signal-to-noise ratio and N is the number of bits per symbol. As N increases $P_e$ is seen to increase.

OBJECTS AND SUMMARY OF THE INVENTION

An object of the present invention is to provide coder/decoder (codec) using a forward error correction (FEC) and detection code.

Another object of the present invention is to provide a codec using an FEC and detection code that is very efficient for burst error detection and correction.

A further object of the present invention is to provide a codec using an FEC and detection code for operating in an ARQ system with efficient code combining.

A still further object of the present invention is to provide a codec using an FEC and detection code capable of correcting errors and/or erasures.

A further object of the present invention is to provide a codec using an FEC and detection code that is easy to implement, and easy to operate.

An additional object of the present invention is to provide a codec using an FEC and detection code that is more powerful and less complex than many prior art codecs.

According to the present invention, as embodied and broadly described herein, a codec using a Schilling-Manela error correcting and detecting code is provided comprising the steps of storing a block of a data-symbol sequence having data symbols with p-bits per symbol, and calculating parity-check symbols. The memory means includes information-memory cells for storing the data symbols, and parity-check memory cells for storing the parity-check symbols. Parity-check symbols are calculated from data symbols, along at least two parity paths having different slopes in the information-memory cells, by adding modulo-$2^p$ the data symbols along each of the parity paths. The parity-check symbols are stored in the parity-check memory cells. The data symbols and parity-check symbols are then transformed into Gray symbols, and the Gray symbols are transformed into modulation symbols.

A codec using PASM error detecting and correcting code encoding method is provided, according to the present invention, comprising the steps of storing a block of a data-symbol sequence having data symbols with p-bits per symbol in memory means, and calculating parity-check symbols with p-bits per symbol. The memory means includes information-memory cells for storing the data symbols, and parity-check memory cells for storing the parity-check symbols. A first set of parity-check symbols are calculated from the data symbols along a first set of parity lines, wherein each parity line of the first set of parity lines has a path with a first slope traversing through the information-memory cells. At least a second set of parity-check symbols are calculated from the data symbols and parity-check symbols along a second set of parity lines, wherein each parity line of the second set of parity lines has a path with a second slope traversing through the information-memory cells and through the parity-check memory cells. The steps further include transforming the data symbols and parity-check symbols into Gray symbols and transforming the Gray symbols into modulation symbols.

The step of calculating a first set of parity-check symbols from the data symbols along a first set of parity lines includes setting the parity-check symbol for each of the first set of parity-check symbols for each parity line equal to the modulo $2^p$ sum of the data symbols along each parity line. The first set of parity-check symbols forms a first parity row located in the parity-check memory cells. The step of calculating at least a second set of parity-check symbols from the data symbols and parity-check symbols along a second set of parity lines includes setting the parity-check symbol for each of the second set of parity-check symbols for each parity line equal to the modulo $2^p$ sum of the data symbols and parity-check symbols along each parity line. The second set of parity-check symbols forms a second parity row located in the parity-check memory cells. The step of transforming the data symbols and parity-check symbols into Gray symbols, and transforming the Gray symbols into modulation symbols, is for transmitting data over a communications channel.

The step of storing a block of a data-symbol sequence in memory means can include memory means having g rows by h columns of information-memory cells, and r rows of parity-check memory cells. Each of the first set of parity lines can have a straight diagonal path with a first slope through the g rows by h columns of the information-memory cells and each of the second set of parity lines can have a straight diagonal path with a second slope through the g rows by h columns of the information-memory cells and through the first parity row of the parity-check memory cells.

The codec using the PASM error detecting and correcting encoding method additionally can include the step of calculating at least a third set of parity-check symbols from the data symbols and parity-check symbols along a third set of parity lines, by setting the parity-check symbol for each of the third set of parity-check symbols for each parity line equal to the modulo $2^p$ sum of the data symbols and parity-check symbols along each parity line. Each parity line of the third set of parity lines has a path with a third slope traversing through the information-memory cells and through the first and second parity rows, and the third set of parity-check symbols forms a third parity row located in the parity-check memory cells.

The present invention also includes a codec using a TASM error correcting and detecting code encoding method comprising the steps of storing a block of a data-symbol sequence having data symbols with p-bits per symbol in memory means, and calculating parity-check symbols. The memory means includes information memory cells for storing data symbols, and parity-check memory cells for storing parity-check symbols. A first parity-check symbol is calculated from data symbols and parity-check symbols located in the information memory cells and parity-check memory cells, respectively, along a first parity path having a first slope passing through the information memory cells and parity-check memory cells. A second parity-check symbol is calculated from data symbols and parity-check symbols located in the information memory cells and parity-check memory cells, respectively, along a second parity path having a second slope passing through the information memory cells and parity-check memory cells. The second parity path traverses through the first parity-check symbol. Thus, the second parity-check symbol is located with reference to the first parity-check symbol, in the second parity row located in the parity-check memory cells. The steps further include transforming data symbols and parity-check symbols into Gray symbols, and transforming the Gray symbols into modulation symbols for transmission over a communications channel.

The step of calculating the first parity-check symbol from data symbols and parity-check symbols located in the information memory cells and parity-check memory cells, respectively, includes adding modulo $2^p$ the data symbols and parity-check symbols along the first parity path. The first parity-check symbol is then stored in a first parity row located in the parity-check memory cells. The step of calculating at least a second parity-check symbol from data symbols and parity-check symbols located in the information memory cells and parity-check memory cells includes the step of adding modulo $2^p$ the data symbols and parity-check symbols along the second parity path, wherein the second parity-check symbol is located and stored at the second slope with reference to each of the first parity-check symbols, respectively, in a second parity row located in the parity-check memory cells.

The codec using the TASM error detecting and correcting encoding method additionally can include the step of calculating at least a third parity-check symbol from data symbols and parity-check symbols located in the information memory cells and parity-check memory cells, respectively, along a third parity path having a third slope passing through the information memory cells and parity-check memory cells, by adding modulo $2^p$ the data symbols and parity-check symbols along the third parity path. The third parity path traverses through the second parity-check symbol. Thus, the third parity-check symbol is located at the third slope with reference to the second parity-check symbol, in the third parity row located in the parity-check memory cells.

The present invention further includes a codec apparatus for encoding a PASM forward error correcting and detecting code, comprising memory means coupled to a data source for storing a block of a data-symbol sequence, processor means coupled to the memory means for calculating parity-check symbols and modulation means coupled to the processor means. The processor means may be embodied as a processor. The processor calculates a first set of parity-check symbols from the data symbols along a first set of parity lines. The first set of parity-check symbols forms a first parity row located in the parity-check memory cells. The processor means further calculates at least a second set of parity-check symbols from the data symbols along a second set of parity lines. The second parity-check symbol forms a second parity row located in the parity-check memory cells. The processor means further transforms the data symbols and the parity-check symbols into Gray symbols. The modulation means is responsive to the processor means for transforming the Gray symbols into modulation symbols.

The present invention also includes a codec apparatus using a TASM error correcting and detecting code encoding comprising memory means coupled to a data source for storing a block of a data-symbol sequence, processor means and modulation means. The memory means includes information memory cells and parity-check memory cells. The processor means calculates a first parity-check symbol from data symbols located in the information memory cells, along a first parity path, and stores the first set of parity-check symbols in a first parity row. The processor means further calculates at least a second parity-check symbol from data symbols and parity-check symbols, along a second parity path having a second slope by adding modulo $2^p$ the data symbols and parity-check symbols along the second parity path. The second parity path traverses through the first parity-check symbol. The processor means stores the second parity-check symbol in the second parity row, and transforms an encoded-data-symbol sequence comprising the data-symbol sequence and the parity-check sequence, into a Gray symbol sequence. The modulation means transforms the Gray symbol sequence into a modulation symbol sequence.

Without departing from the spirit or scope of the present invention, the method and apparatus of the present invention may include having the data-symbol sequence blocked and stored in a $\lambda$-dimensional memory. In this more general case, there would be sufficient rows and columns to correspond to the $\lambda$-dimensional system. Further, parity-check symbols can be calculated from data symbols and parity-check symbols, along parity lines having curved paths passing through the $\lambda$-dimensional system.

Additional objects and advantages of the invention will be set forth in part in the description which follows, and in part will be obvious from the description, or may be learned by practice of the invention.

BRIEF DESCRIPTION OF THE DRAWINGS

The accompanying drawings, which are incorporated in and constitute a part of this specification, illustrate a preferred embodiment of the invention, and together with the description, serve to explain the principles of the invention.

DETAILED DESCRIPTION OF THE PREFERRED EMBODIMENTS

Reference will now be made to the present preferred embodiments of the invention, examples of which are illustrated in the accompanied drawings. The following description is an extension of two currently pending U.S. patent applications: Schilling and Manela, "Schilling-Manela Forward Error Correction and Detection Code Method and Apparatus", U.S. patent application Ser. No. 07/032,011, filed Mar. 30, 1987; and, Schilling and Manela, "PASM and TASM Forward Error Correction and Detection Code Method and Apparatus", U.S. patent application Ser. No. 07/080,767, filed Aug. 3, 1987, which are expressly incorporated herein by reference.

Figure 1:
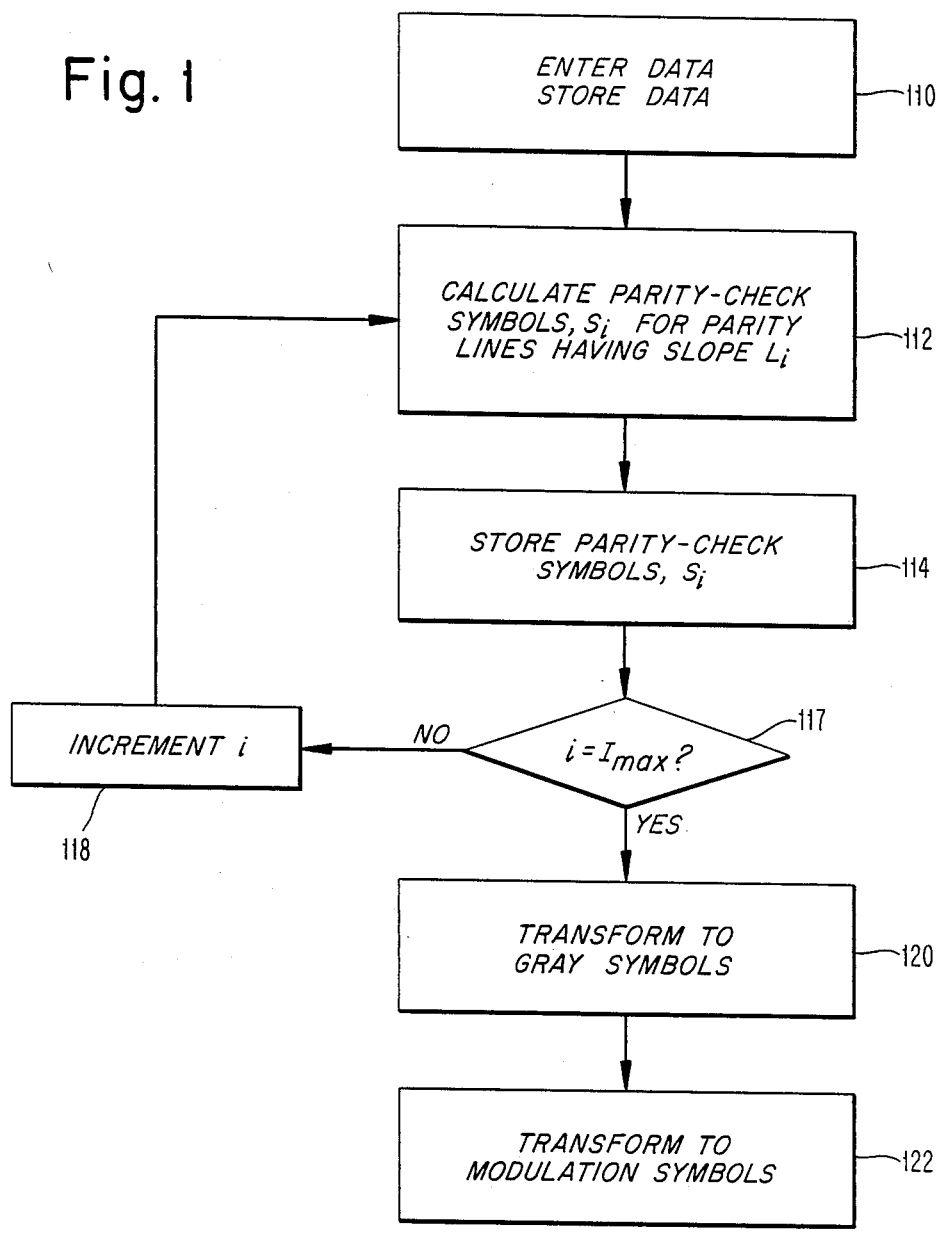
FIG. 1 shows a flow diagram of the SM encoding method according to the present invention.

Referring to FIG. 1, a preferred embodiment of a codec using an SM forward error correction and detection coding method is shown comprising the steps of entering and storing 110 a block of a data-bit sequence having data symbols with p-bits per symbol, in memory means. The memory means can have g rows by h columns of information-memory cells for storing the data symbols, and $R_{max}$ rows of parity-check memory cells for storing parity-check symbols. The memory means may be embodied as a memory including a random access memory, or any other memory wherein data readily may be accessed. The method includes calculating 112 a first (r=1) set of parity-check symbols from the data symbols along a first set of parity lines having slope $L_r$, wherein each set of the first set of parity lines has a path traversing through the information-memory cells. More generally, the parity lines may be parity paths traversing through the information-memory cells. The parity-check symbols $S_i$ are stored 114 in the first (r=1) parity row of the parity-memory cells. The method increments 118 a counter to the next (r+1) number and proceeds to calculate the (r+1)th set of parity-check symbols. In the step of calculating the (r+1)th set of parity-check symbols, the parity-check symbols are calculated from data symbols along parity lines having slope $L_{r+1}$. During this and subsequent steps, the parity-check symbols are the calculated parity for data symbols along the parity path. The method determines 117 whether all the sets of parity-check symbols, which corresponds to the number of rows, $R_{max}$, have been calculated. After calculating the parity-check symbols, the method includes transforming 120 the data symbols and parity-check symbols into Gray symbols.

Figures 5, 6:
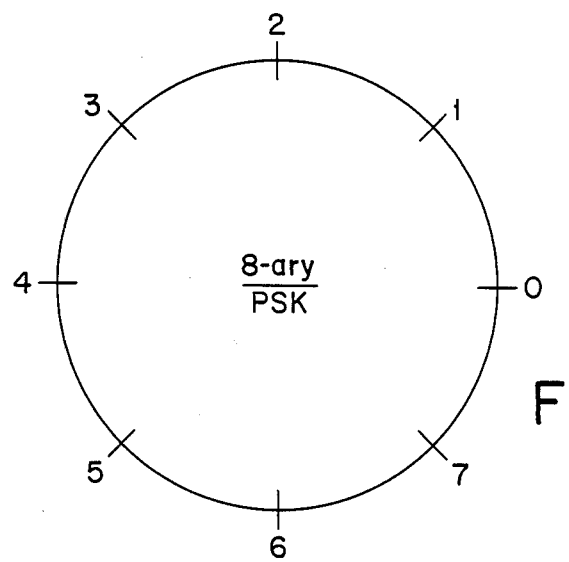
FIG. 5 illustrates an example of the Gray code for three bit word per symbol.
FIG. 6 illustrates symbols being transmitted using 8-ary PSK.

A Gray code for transforming symbols having 3 bits per symbol is shown in FIG. 5. A Gray code is characterized by having a minimum distance between adjacent symbols; and a distance greater than the minimum distance for non-adjacent symbols. As shown in FIG. 5, for 3 bits per symbol, adjacent symbols differ by no more than 1 bit. Symbols which are not adjacent, however, have a difference in bits of at least 2. Thus, symbol 3, which has bits 010, and symbol 4, which has bits 110, differ in the first bit, while symbol 2 which has bits 011 differs in the last bit from symbol 3. The 5th symbol which is not adjacent to symbol 3, however, and has bits 111, differs in the first and last bits from symbol 3. Similarly, the 6th symbol which has bits 101 differs in all three bits from symbol 3.

The method further includes, as shown in FIG. 1, transforming 122 the Gray symbols into modulation symbols. The modulation symbols can be any standard modulation such as phase shift keying, frequency shift keying, or amplitude shift keying, or a combination of any of these modes of modulation. FIG. 6 illustratively shows an 8-ary PSK system with the respective locations for a particular phase, of the Gray symbols of FIG. 5.

Figure 2:
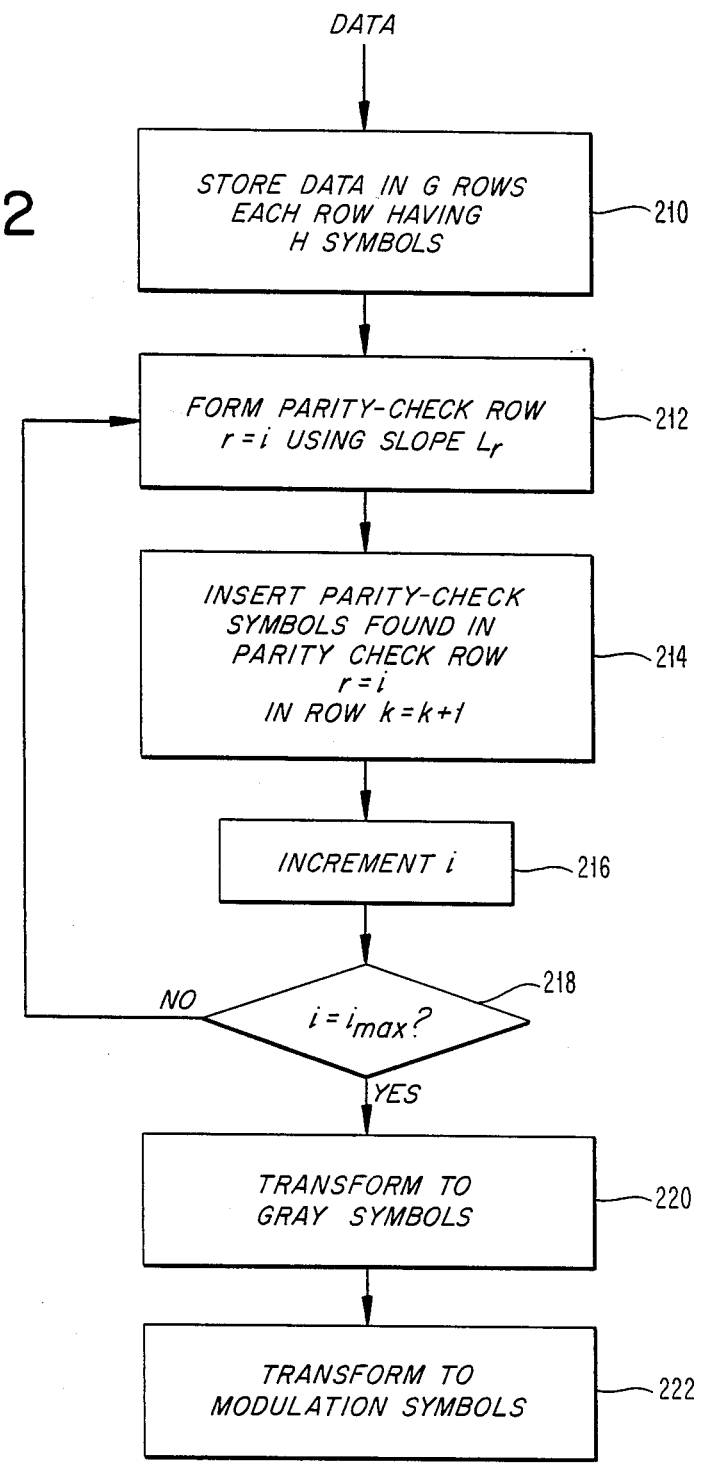
FIG. 2 shows a flow diagram of a PASM encoding method according to the present invention.

The SM codec can further include an embodiment using the PASM encoding method. As illustratively shown in FIG. 2, a preferred embodiment of PASM error correction and detection code encoding method is shown comprising the steps o entering and storing 210 a block of a data-bit sequence having data symbols with p-bits per symbol, in memory means. As in the SM coding method, the memory means has g rows by h columns of information-memory cells for storing the data symbols, and $R_{max}$ rows of parity-check memory cells for storing parity-check symbols. The memory means may be embodied as a memory including a random access memory, or any other memory. The method includes calculating 212 a first (r=1) set of parity-check symbols from the data symbols along a first set of parity lines having slope $L_r$, wherein each set of the first set of parity lines has a path traversing through the information-memory cells. More generally, the parity lines may be parity paths traversing through the information-memory cells. The parity-check symbols $S_i$ are stored 214 in the first (r=1) parity row of the parity-check memory cells. The method increments 216 a counter to the next number, (r+1), of the set of the parity-check symbols, and proceeds to calculate the (r+1)th set of parity-check symbols. In the step of calculating the (r+1)th set of parity-check symbols, the parity-check symbols are calculated from data symbols and parity-check symbols located in the information memory cells and parity-check memory cells, respectively, along the parity lines having slope $L_r$. During this and subsequent steps, the parity-check symbols are calculating parity for data symbols and parity-check symbols along the parity paths. The method determines 218 whether all the sets of parity-check symbols, which corresponds to the number of parity rows, $R_{max}$, have been calculated, and transforms 220 the data symbols and parity-check symbols into Gray symbols. In the event that the count is less than $R_{max}$ then the method proceeds to calculate the next set of parity-check symbols. The steps include transforming the Gray symbols into modulation symbols. The purpose and function of transforming the data symbols and parity-check symbols into Gray symbols and then modulation symbols, is similar for that previously described for the SM code.

Figure 3:
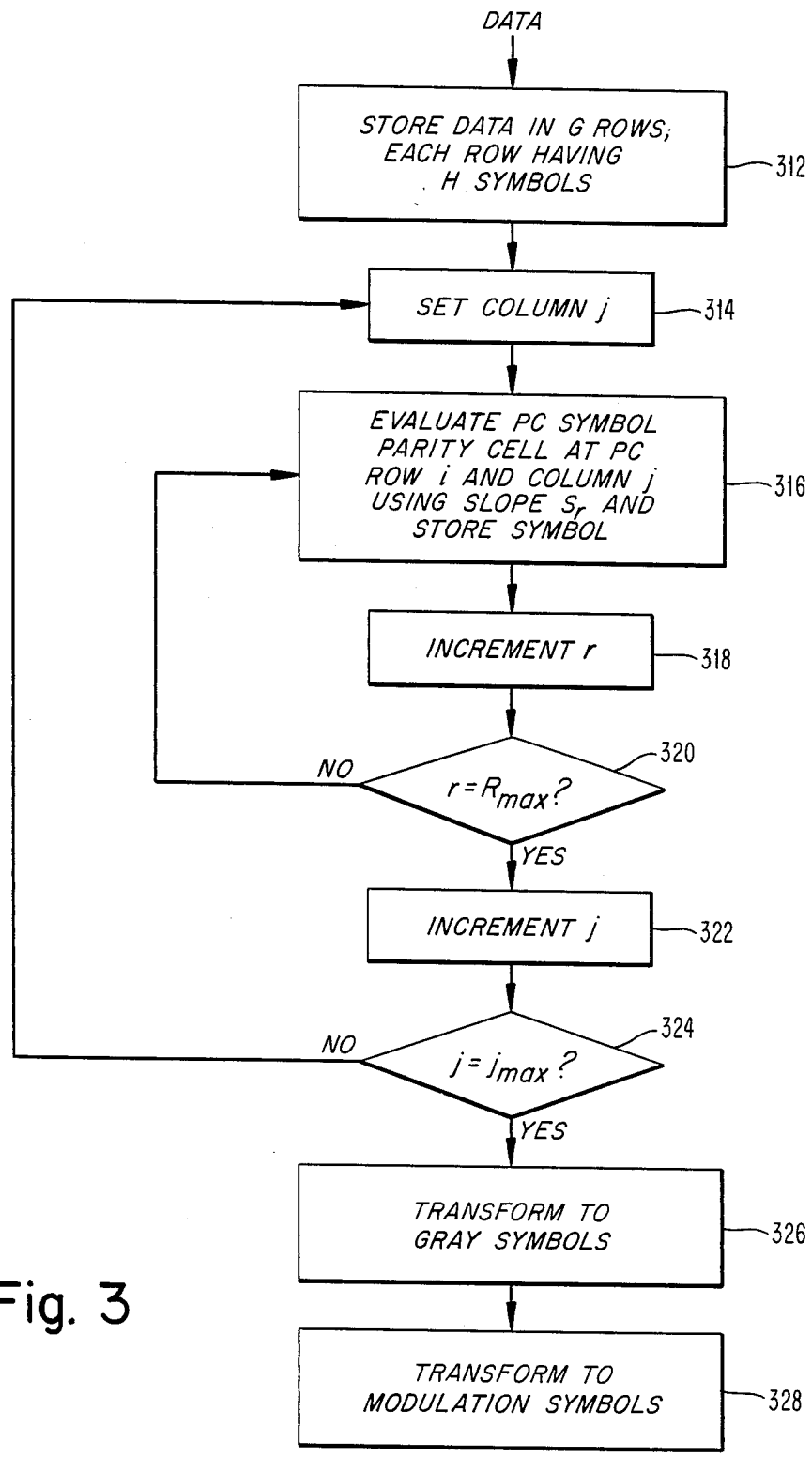
FIG. 3 shows a flow diagram of TASM encoding method according to the present invention.

Referring to FIG. 3, a preferred embodiment of the SM codec using the TASM error correction and detection code encoding method is shown, comprising the steps of entering and storing 312 a block of a data-bit sequence having data symbols with p-bits per symbol, in memory means. As previously described, the memory means has g rows by h columns of information-memory cells for storing the data symbols, and $R_{max}$ rows of parity-check memory cells for storing parity-check symbols. The memory means may be embodied as a memory including a random access memory or any other memory. The method includes evaluating 316 a first parity-check symbol from data symbols and parity-check symbols located in the information-memory cells and parity-check memory cells, respectively, along a first parity line having a first slope passing through the information-memory cells and parity-check memory cells. The parity lines more generally can be considered parity paths through the information-memory cells and parity-check memory cells. The first parity-check symbol is stored 316 in a first parity row (r=1). The method includes incrementing 318 a counter and determining 320 whether the count is less than or equal to the maximum number of parity rows ($R_{max}$). In the event the count is less than or equal to $R_{max}$, the method proceeds to calculate the next parity-check symbol. Accordingly, a second parity-check symbol is calculated 316 from the data symbols and parity-check symbols located in the information-memory cells and paritychecks memory cells, respectively, along a second parity line having a second slope through the information memory cells and parity-check memory cells. The second parity-check symbol is stored 316 in the second parity row. The second parity line traverses through the first parity-check symbol. Thus, the second parity-check symbol is located with reference to the first parity-check symbol, in the second parity row located in the parity-check memory cells.

A third parity-check symbol can be calculated 316 from the data symbols and parity-check symbols located in the information memory cells and parity-check memory cells, respectively, along a third parity line having a third slope passing through the information-memory cells and parity-check memory cells. The third parity line traverses through the second parity-check symbol. Thus, the third parity-check symbol is located at the third slope with reference to the second parity-check symbol, in the third parity row in the parity-check memory cells.

Parity-check symbols are calculated for all the parity rows. Upon calculating a parity-check symbol for the last parity row, $R_{max}$, the method determines 320 that the parity-check symbol for the last parity row has been calculated and increments 322 a column counter to move to the next column. Accordingly, the method calculates 316 a parity-check symbol starting, again, with the first parity row, using a parity line having the first slope. Subsequently, parity-check symbols are calculated from the second, third, etc., parity rows until a set of parity-check symbols are calculated for all the parity rows. Each parity-check symbol is calculated using a parity line having a slope corresponding to a particular parity row.

The process of calculating parity-check symbols is repeated until parity-check symbols are calculated for all parity rows and columns. This can be determined using a column counter and determining 324 whether all columns have been used ($J_{max}$). Upon calculating the parity-check symbols for all the parity rows, and columns, the method can include transforming 326 the data symbols and parity-check symbols into Gray symbols. Subsequently, the Gray symbols are transformed into modulation symbols.

The SM Codec of the present invention can be illustrated by looking, without loss of generality, at one particular type of code. For illustrative purposes, the PASM code will be used with $R_{max}=2$ parity-check rows, PC1 and PC2, with slopes 1 and ½, respectively, employed. Thus, the SM code and TASM code could be used in place of the PASM code without loss of generality; however, the focus of this description hereinafter will be on the interface of one of these coding techniques with a Gray code and modulation symbols.

Figure 4:
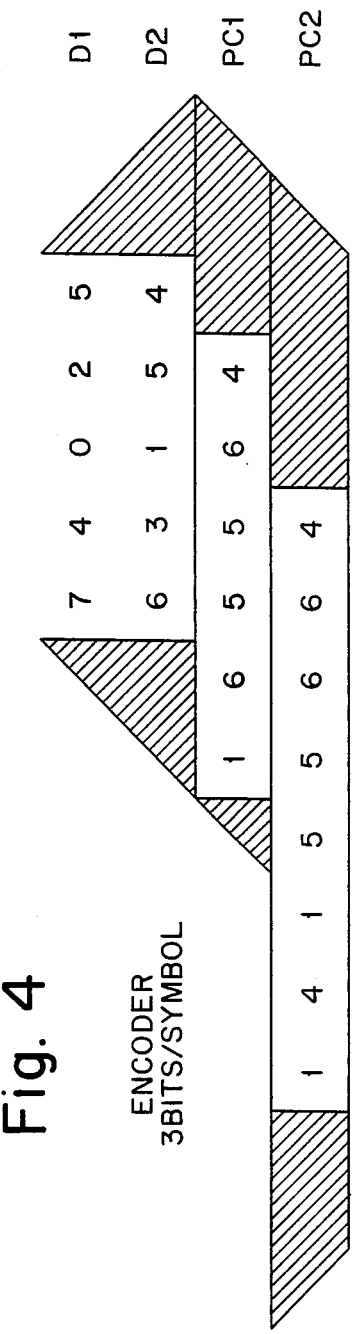
FIG. 4 shows a data graph having 3 bits per symbol with first and second data rows and first and second parity check rows using the PASM code.

FIG. 4 illustratively shows a data graph having data rows D1 and D2, using 3 bits per symbol. For purposes of illustration, the parity-check symbols are shown in parity check rows, PC1 and PC2, which have been calculated using the PASM code. Note that in this particular case, all sums of each parity check row are equal to modulo $2^3=8$. The Gray code which is used to transform the data symbols and parity-check symbols of FIG. 4, is shown in FIG. 5. In this particular Gray code, the Gray data bits are shown in the column as they come out of the process of encoding the PASM code, transformed into symbols 1, 2, 3, 4, 5, 6, or 7, with the corresponding data bits. This particular Gray code has the property that adjacent symbols differ in no more than one bit, but symbols which are not adjacent differ by at least 2 bits.

FIG. 6 illustratively shows how each symbol from the Gray code can be transmitted using 8-ary PSK. Note that in each case the adjacent symbols differ by one. This type of arrangement has the advantage that if phase 4 is transmitted, for example, and received in error then it is far more likely that phase 3 or 5 were originally transmitted than any other phases. This is because the distance from phase 4 to any other phase is almost a factor of 2 times greater than phases 3 or 5. Hence, the probability of such an error is more than 1000 times greater. This change causes the error graph to generate errors by $+1$ or $-1$ and rarely by any other value.

Figure 7:
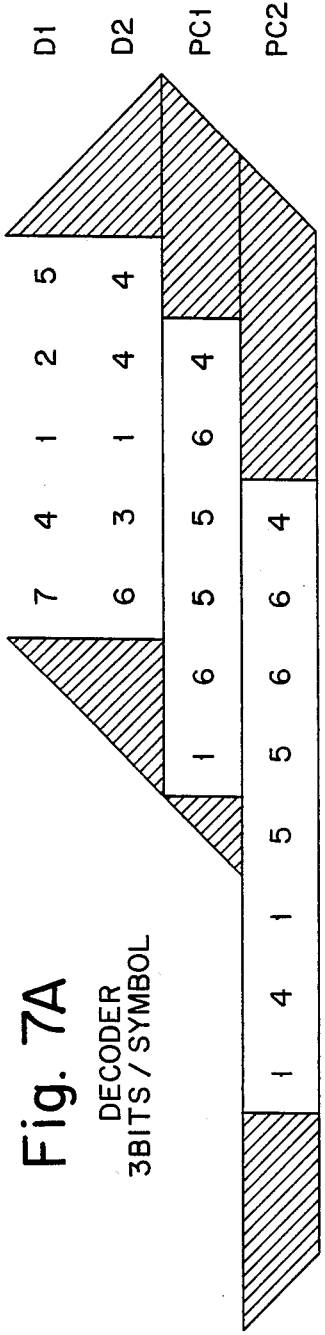
FIG. 7A shows a data graph of received data and parity check symbols having two errors present.
FIG. 7B is an error graph for parity check row 1.
FIG. 7C is the error graph for parity check row 2.
FIG. 7D shows the combined error diagrams from FIG. 7B and FIG. 7C.
Figure 8:
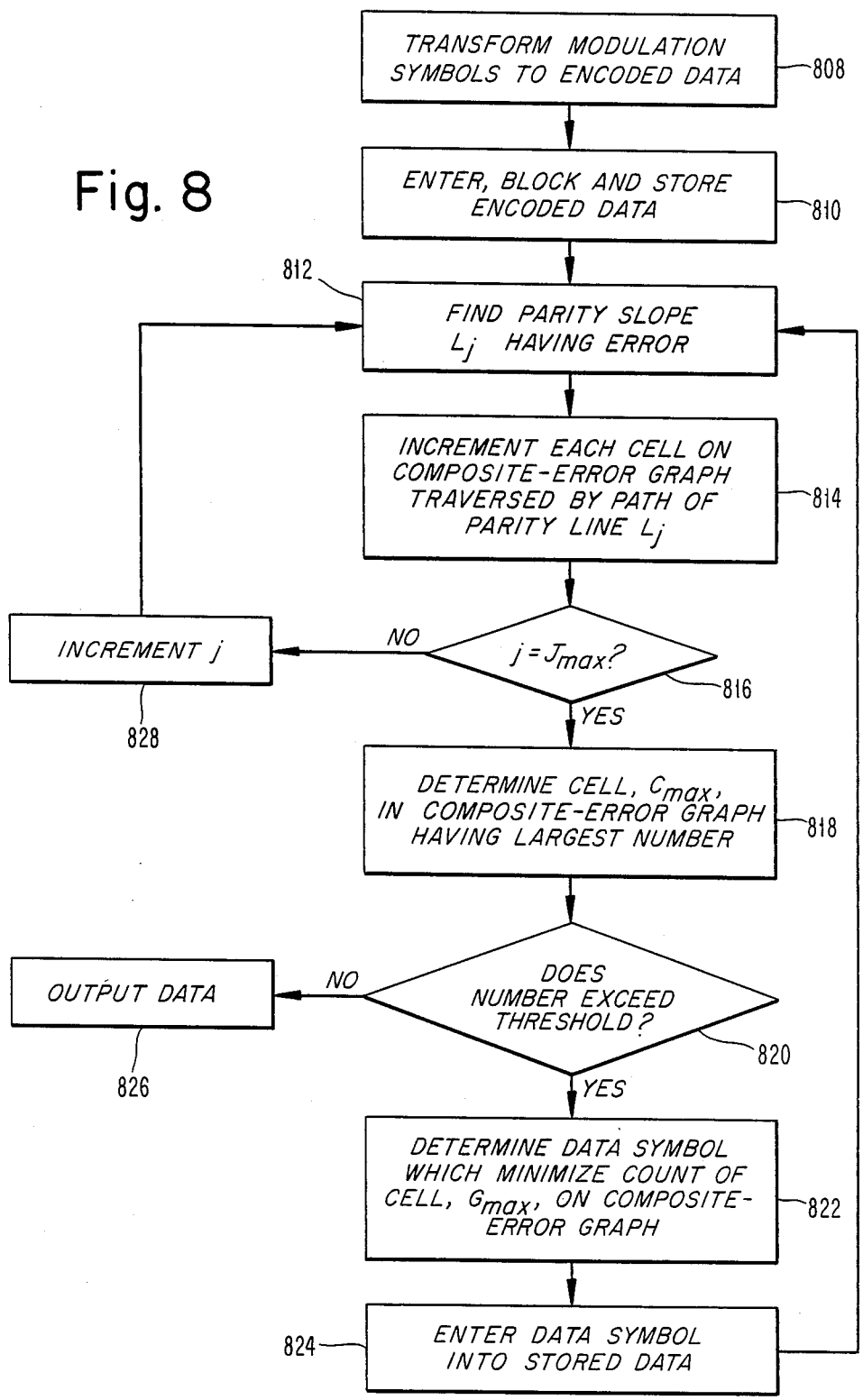
FIG. 8 shows a procedure for decoding a SM, PASM and TASM code.

FIG. 7A shows a data graph wherein the received phases have been transformed into data symbols and parity-check symbols. Note that these symbols incorporate the property of the Gray code, which was originally used to encode the data symbols and parity-check symbols prior to transmission over the channel. FIG. 7B is the error graph for the first parity check row (slope =1) and FIG. 7C is the error graph for the second parity check row PC 2 (slope=½). FIG. 7D shows a combined error diagram. Note that in row 1, column 3 the error is positive and in row 2, column 4 the error is negative. Note that in this particular case that if error is positive, the correct procedure is to decrease the symbol by one in that cell, and if the error is negative, the correct procedure is to increase the symbol by one. Due to the properties of using a Gray code in combination, in this particular case, with the PASM code, the decoding process is simplified. With the assumption that it is far more likely that only one bit is in error rather than two or three bits in a three bit symbol, this particular algorithm offers simplicity or using the PASM code with an arbitrary symbol-data bit encoding. The decoding method illustrated in FIG. 8 can be used with the present invention.

Figure 9:
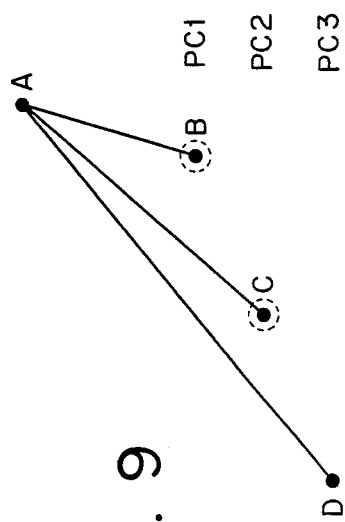
FIG. 9 illustrates the analysis of a PASM codec with r=3 parity check rows.

The advantage of using a Gray code with the PASM codec with $R_{Max}=3$ parity-check rows is shown in FIG. 9. If the data symbol A is in error, then the error will not be detected if parity symbols C and D are in error the correct way. That is, if A was increased due to an error, C and D each both have to be decreased due to errors. Thus, the probability of not correcting an error is:

$$P_e \alpha [0.5]^2 p^3$$

The reduction in $P_e$ by $(\frac{1}{2})^m$ is a direct result of symbol decoding.

Cyclic Coding

Figure 10:
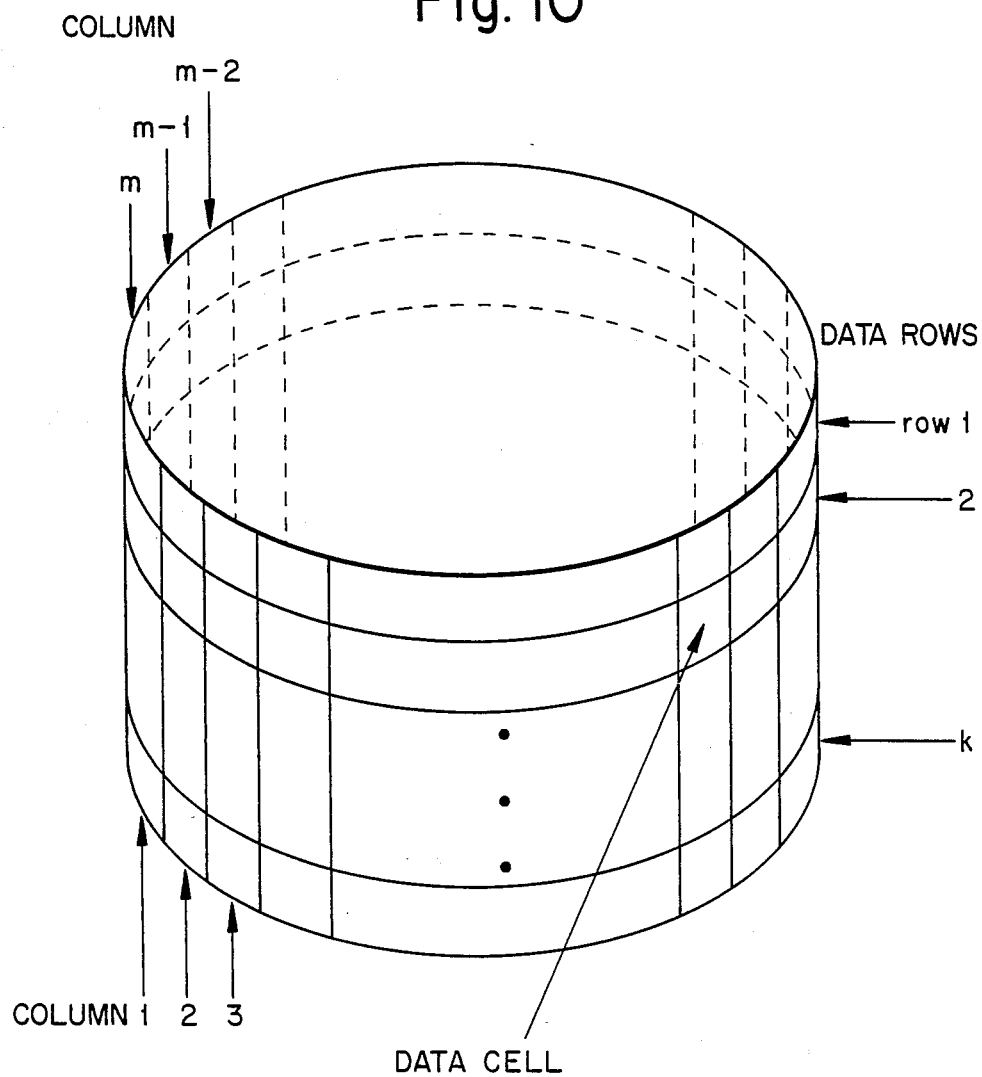
FIG. 10 shows a ring register embodiment of the present invention.

The SM, PASM, and TASM codecs can operate in a cyclic mode. In this embodiment, all of the data cells, g rows by h columns, are a ring register as shown in FIG. 10. Accordingly, the codecs operate cyclically, with parity-check symbols repeating as the data symbols repeat. Further, since there is no augmentation of zeroes, but instead a "wraparound" the ring register, the code efficiency becomes 100%.

It would be apparent to those skilled in the art that various modifications can be made to the SM codec of the instant invention without departing from the scope or spirit of the invention, and it is intended that the present invention cover modifications and variations of the SM codec provided they come within the scope of the appended claims and their equivalents.

I claim:

1. A process for encoding a Schilling-Manela error correcting and detecting code comprising the steps of:
    storing a block of a data-symbol sequence having data symbols with p-bits per symbol, in memory means having information-memory cells and parity-check memory cells;

calculating parity-check symbols from data symbols, along at least two parity paths having different slopes in said information-memory cells by adding modulo-$2^p$ the data symbols along each of the parity paths;

setting the parity-check symbol for each parity path equal to the modulo-$2^p$ sum of the data symbols along each of the parity paths, respectively;

transforming the data symbols and parity-check symbols into Gray symbols, having a minimum distance between adjacent symbols, and thereby generating a Gray symbol sequence; and transforming the Gray symbol sequence into a modulation symbol sequence, for transmission over a communications channel.

2. A process for encoding a Schilling-Manela error correcting and detecting code comprising the steps of:

storing a block of a data-symbol sequence having data symbols with p-bits per symbol, in memory means having information-memory cells and parity-check memory cells;

calculating parity-check symbols from data symbols, along a first and a second set of parity lines, each of the first set of parity lines having a straight diagonal path with a first slope through said information-memory cells and each of the second set of parity lines having a straight diagonal path with a second slope through said information-memory cells, by adding modulo-$2^p$ the parity-line symbols along each of the parity lines, respectively;

setting the parity-check symbol for each parity line equal to the modulo-$2^p$ sum of the parity-line symbols along each parity line, respectively;

storing the parity-check symbols in parity-memory cells of said memory means;

transforming the data symbols and parity-check symbols into Gray symbols, having a minimum distance between adjacent symbols, and thereby generating a Gray symbol sequence; and transforming the Gray symbol sequence into a modulation symbol sequence, for transmission over a communications channel.

3. A process for decoding a Schilling-Manela error correcting and detecting code encoded sequence, transformed by a Gray code and transformed to a modulation-symbol sequence, comprising the steps of:

transforming the modulation symbol sequence encoded with a Gray code into an encoded-data-symbol sequence;

storing the encoded-data-symbol sequence in memory means having at least g rows by h columns of information-memory cells and $R_{Max}$ rows of parity-memory cells, wherein said encoded-data-symbol sequence includes a parity-check-symbol sequence having parity-check symbols stored in the $R_{Max}$ rows of parity-memory cells, and a data-symbol sequence blocked and stored in the g rows by h columns of information-memory cells;

determining parity lines in memory means with data symbols and parity-check symbols, having an error;

incrementing a count of each composite cell on a composite-error graph traversed by a path of each of the parity lines having an error;

determining the largest-number cell in the composite-error graph having the largest number;

comparing the largest number to a threshold;

determining, provided the largest number exceeds the threshold, a new-data symbol for the memory cell in the information-memory cells corresponding to the largest-number cell in the composite-error graph having the largest number, wherein the new-data symbol minimizes the count in the largest-number cell; and substituting the new-data symbol into the stored data-symbol sequence.

4. A process for decoding a data-symbol sequence encoded with a Schilling-Manela error correcting and detecting code encoded sequence, transformed by a Gray code and transformed to modulation symbol sequence, comprising the steps of:

transforming the modulation symbol sequence into an encoded-data-symbol sequence;

storing the encoded-data-symbol sequence in memory means having at least g rows by h columns of information-memory cells and $R_{Max}$ rows of parity-memory cells, wherein said encoded-data-symbol sequence includes a parity-check-symbol sequence having parity-check symbols stored in the $R_{Max}$ rows of parity-memory cells, and a data-symbol sequence having information symbols blocked and stored in the g rows by h columns of information-memory cells;

determining a first parity line in memory means with data symbols and parity-check symbols, having an error;

determining a second parity line in memory means with data symbols and parity-check symbols, having an error;

comparing the data symbols and parity-check symbols along the first and second parity lines, respectively, for determining the parity-line symbol having an error;

substituting a new symbol for the parity-line symbol having an error so that first and second parity lines are not in error; and outputting the corrected data-symbol sequence.

5. A Schilling-Manela error correcting and detecting code encoding apparatus comprising:

memory means having g rows by h columns of information-memory cells and $R_{Max}$ rows of parity-memory cells coupled to a data source for storing a block of a data-symbol sequence;

processor means coupled to said memory means for calculating parity-check symbols having p-bits per symbol, along a first and a second set of parity lines, each of the first set of parity lines having a straight diagonal path with a first slope through the g rows by h columns of said information-memory cells and each of the second set of parity lines having a straight diagonal path with a second slope through the g rows by h columns of said information-memory cells, by adding modulo-$2^p$ the data symbols along each of the parity lines, respectively, and setting the parity-check symbol for each parity line equal to the modulo-$2^p$ sum of the data symbols along each parity line, respectively, and storing the parity-check symbols in the parity-memory cells of said memory means, and outputting an encoded-data-symbol sequence comprising the data-symbol sequence and the parity-check symbols;

Gray means for transforming the encoded-data-symbol sequence into a Gray-symbol sequence; and modulation means responsive to the Gray symbol sequence for generating a modulation-symbol sequence.

6. A Schilling-Manela error correcting and detecting code encoding apparatus comprising:

memory means having g rows by h columns of information-memory cells and $R_{max}$ rows of parity-memory cells coupled to a data source for storing a block of a data-symbol sequence;

processor means coupled to said memory means for calculating a plurality of parity-check symbols from data symbols having p bits per symbol, along a plurality of parity paths in the g rows by h columns of said information-memory cells by adding modulo-$2^p$ the data symbols along each of the parity paths, and setting the parity-check symbol for each parity path equal to the modulo-$2^p$ sum of the data symbols along each of the parity paths, respectively;

Gray means for transforming an encoded-data-symbol sequence into a Gray-symbol sequence; and modulation means responsive to the Gray symbol sequence for generating a modulation-symbol sequence.

7. A Schilling-Manela decoding apparatus comprising:

demodulation means coupled to a data source for transforming a modulation-symbol sequence into an encoded-data-symbol sequence;

memory means having at least g rows by h columns of information-memory cells and $R_{max}$ rows of parity-memory cells, coupled to said demodulation means for storing a block of an encoded-data-symbol sequence, wherein said encoded-data-symbol sequence includes a parity-check-symbol sequence having parity-check symbols stored in the parity-memory cells and a data-symbol sequence having information symbols stored in the g rows by h columns of said information-memory cells;

a composite-error graph having g rows by h columns and $R_{max}$ rows of composite cells; and processor means coupled to said memory means and said composite-error graph for finding the parity-check symbols and the data symbols along parity lines in the g rows by h columns of information-memory cells, having an error, incrementing a count of each composite cell on the composite-error graph traversed by a path of each of the parity lines having an error, determining the largest-number cell in the composite-error graph having the largest number, comparing the largest number to a threshold, determining, provided the largest number exceeds the threshold, a new-data symbol for the memory cell in the information-memory cells corresponding to the largest-number cell in the composite-error graph having the largest number, wherein the new-data symbol minimizes the count in the largest-number cell, and substituting the new-data symbol into the information-memory cells.

8. A Schilling-Manela decoding apparatus comprising:

demodulation means coupled to a data source for transforming a modulation-symbol sequence into an encoded-data-symbol sequence;

memory means having at least g rows by h columns of information-memory cells and $R_{max}$ rows of parity-memory cells, coupled to said demodulation means for storing a block of an encoded-data-bit sequence, wherein said encoded-data-bit sequence includes a parity-check-bit sequence having parity-check bits stored in the $R_{max}$ rows of parity-memory cells and a data-bit sequence having information bits stored in the g rows by h columns of said information-memory cells;

a composite-error graph having g rows by h columns of composite cells; and processor means coupled to said memory means and said composite-error graph for finding the parity-check bits and the data bits along parity lines in the g rows by h columns of information-memory cells, having an error, incrementing a count of each composite cell on a composite-error graph traversed by the path of each of the parity lines having an error, determining the largest-number cell in the composite-error graph having the largest number, comparing the largest number to a threshold, and inverting, provided the largest number exceeds the threshold, the data bit in the information-memory cells corresponding to the largest-number cell in the composite-error graph having the largest number, thereby a new-data bit minimizes the count in the largest-number cell.

9. A process for decoding a Schilling-Manela error correcting and detecting code comprising the steps of:

demodulating a modulation-symbol sequence into an encoded-data-symbol sequence;

storing the encoded-data-bit sequence in memory means having $\lambda$-dimensional information-memory cells and $R_{max}$ rows of parity-memory cells, wherein said encoded-data-symbol sequence includes a parity-check-symbol sequence having parity-check symbols stored in the parity-memory cells, and a data-symbol sequence blocked and stored in the $\lambda$-dimensional information-memory cells;

finding the parity-check symbols and the data symbols along parity lines in the information-memory cells, having an error;

incrementing a count of each composite cell on a composite-error graph traversed by the path of each of the parity lines having an error;

determining the largest-number cell in the composite-error graph having the largest number;

comparing the largest number to a threshold;

determining, provided the largest number exceeds the threshold, a new-data symbol for the memory cell in the information-memory cells corresponding to the largest-number cell in the composite-error graph having the largest number, wherein the new-data symbol minimizes the count in the largest-number cell; and substituting the new-data symbol into the stored data-symbol sequence.

10. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, by setting the parity-check symbol for each of the first set of parity-check symbols for each parity line equal to the modulo-$2^p$ sum of the data symbols along each parity line, wherein each parity line of the first set of parity lines has a path with a first slope traversing through said information-memory cells, and said first set of parity-check symbols forms a first parity row located in said parity-check memory cells;

calculating at least a second set of parity-check symbols from the data symbols and parity-check symbols along a second set of parity lines, by setting the parity-check symbol for each of the second set of parity-check symbols for each parity line equal to the modulo-$2^p$ sum of the data symbols and parity-check symbols along each parity line, wherein each parity line of the second set of parity lines has a path with a second slope traversing through said information-memory cells and through said first parity row, and said second set of parity-check symbols form a second parity row located in said parity-check memory cells;

transforming the data symbols and parity-check symbols into Gray symbols, having a minimum distance between adjacent symbols, and thereby generating a Gray symbol sequence; and transforming the Gray symbol sequence into a modulation symbol sequence, for transmission over a communications channel.

11. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, by setting the parity-check symbol for each of the first set of parity-check symbols for each parity line equal to the modulo-$2^p$ sum of the data symbols along each parity line, wherein each parity line of the first set of parity lines has a path with a first slope traversing through said information-memory cells, and said first set of parity-check symbols forms a first parity row located in said parity-check memory cells;

calculating a second set of parity-check symbols from the data symbols and parity-check symbols along a second set of parity lines, by setting the parity-check symbol for each of the second set of parity-check symbols for each parity line equal to the modulo-$2^p$ sum of the data symbols and parity-check symbols along each parity line, wherein each parity line of the second set of parity lines has a path with a second slope traversing through said information-memory cells and through said first parity row, and said second set of parity-check symbols form a second parity row located in said parity-check memory cells;

calculating at least a third set of parity-check symbols from the data symbols and parity-check symbols along a third set of parity lines, by setting the parity-check symbol for each of the third set of parity-check symbols for each parity line equal to the modulo-$2^p$ sum of the data symbols and parity-check symbols along each parity line, wherein each parity line of the third set of parity lines has a path with a third slope traversing through said information-memory cells and through said first and second parity rows, and said third set of parity-check symbols form a third parity row located in said parity-check memory cells;

transforming the data symbols and parity-check symbols into Gray symbols, having a minimum distance between adjacent symbols, and thereby generating a Gray symbol sequence; and transforming the Gray symbol sequence into a modulation symbol sequence, for transmission over a communications channel.

12. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

calculating a second set of parity-check symbols from the data symbols and parity-check symbols along a second set of parity lines, wherein each parity line of the second set of parity lines has a path with a second slope traversing through said information-memory cells and through said parity-check memory cells;

calculating at least a third set of parity-check symbols from the data symbols and parity-check symbols along a third set of parity lines, wherein each parity line of the third set of parity lines has a path with a third slope traversing through said information-memory cells and through said parity-check memory cells;

transforming the data symbols and parity-check symbols into Gray symbols, having a minimum distance between adjacent symbols, and thereby generating a Gray symbol sequence; and transforming the Gray symbol sequence into a modulation symbol sequence, for transmission over a communications channel.

13. A process for encoding a PASM error correcting and detecting code comprising the steps of:

storing a block of a data-symbol sequence having data symbols with p-bits per symbol, in memory means having information-memory cells and parity-check memory cells;

calculating a first set of parity-check symbols from the data symbols along a first set of parity lines, wherein each parity line of the first set of parity lines has a path with a first slope traversing through said information-memory cells;

storing said first set of parity-check symbols in a first parity row located in said parity-check memory cells;

calculating at least a second set of parity-check symbols from the data symbols and parity-check symbols along a second set of parity lines, wherein each parity line of the second set of parity lines has a path with a second slope traversing through said information-memory cells and through said first parity row;

storing said second set of parity-check symbols in a second parity row located in said parity-check memory cells;

transforming the data symbols and parity-check symbols into Gray symbols, having a minimum distance between adjacent symbols, and thereby generating a Gray symbol sequence; and transforming the Gray symbol sequence into a modulation symbol sequence, for transmission over a communications channel.

14. A process for encoding a TASM error correcting and detecting code comprising the steps of:
   storing a block of a data-symbol sequence having data symbols with p-bits per symbol, in memory means having information memory cells and parity-check memory cells;
   calculating a first parity-check symbol from data symbols and parity-check symbols located in the information memory cells and parity-check memory cells, respectively, along a first parity path having a first slope passing through the information memory cells and parity-check memory cells by adding modulo $2^p$ the data symbols and parity-check symbols along the first parity path;
   storing said first parity-check symbol in a first parity row located in said parity-check memory cells;
   calculating a second parity-check symbol from data symbols and parity-check symbols located in the information memory cells and parity-check memory cells, respectively, along a second parity path having a second slope by adding modulo $2^p$ the data symbols and parity-check symbols along the second parity path, wherein said second parity path traverses through said first parity-check symbol;
   storing said second parity-check symbol in said second parity row;
   transforming the data symbols and parity-check symbols into Gray symbols, having a minimum distance between adjacent symbols, and thereby generating a Gray symbol sequence; and
   transforming the Gray symbol sequence into a modulation symbol sequence, for transmission over a communications channel.

15. A process for encoding a TASM error correcting and detecting code comprising the steps of:
   storing a block of a data-symbol sequence having data symbols with p-bits per symbol, in memory means having information memory cells and parity-check memory cells;
   calculating a first parity-check symbol from data symbols and parity-check symbols located in the information memory cells and parity-check memory cells, respectively, along a first parity path having a first slope passing through the information memory cells and parity-check memory cells by adding modulo $2^p$ the data symbols and parity-check symbols along the first parity path;
   storing said first parity-check symbol in a first parity row located in said parity-check memory cells;
   calculating a second parity-check symbols from data symbols and parity-check symbols located in the information memory cells and parity-check memory cells, respectively, along a second parity path having a second slope by adding modulo $2^p$ the data symbols and parity-check symbols along the second parity path, wherein said second parity path traverses through said first parity-check symbol;
   storing said second parity-check symbol in said second parity row;
   calculating at least a third parity-check symbol from data symbols and parity-check symbols located in the information memory cells and parity-check memory cells, respectively, along a third parity path having a third slope passing through the second parity-check row, and through the information memory cells and parity-check memory cells, by adding modulo $2^p$ the data symbols and parity-check symbols along the third parity path, wherein said third parity path traverses through said second parity-check symbol;
   storing said third parity-check symbol in a third parity row located in said parity-memory cells;
   transforming the data symbols and parity-check symbols into Gray symbols, having a minimum distance between adjacent symbols, and thereby generating a Gray symbol sequence; and
   transforming the Gray symbol sequence into a modulation symbol sequence, for transmission over a communications channel.

16. A process for encoding a TASM error correcting and detecting code comprising the steps of:
   storing a block of a data-symbol sequence having data symbols with p-bits per symbol, in memory means having information memory cells and parity-check memory cells;
   calculating a first parity-check symbol from data symbols and parity-check symbols located in the information memory cells and parity-check memory cells, respectively, along a first parity path having a first slope passing through the information memory cells and parity-check memory cells;
   calculating at least a second parity-check symbol from data symbols and parity-check symbols located in the information memory cells and parity-check memory cells, respectively, along a second parity path having a second slope, wherein said second parity path traverses through said first parity-check symbol;
   transforming the data symbols and parity-check symbols into Gray symbols, having a minimum distance between adjacent symbols, and thereby generating a Gray symbol sequence; and
   transforming the Gray symbol sequence into a modulation symbol sequence, for transmission over a communications channel.

17. A process for using a PASM error correcting and detecting code in an ARQ channel, comprising the steps of:
   storing a block of a data-symbol sequence having data symbols with p-bits per symbol, in memory means having information memory cells and parity-check memory cells;
   calculating a first parity-check symbol from data symbols located in the information memory cells along a first parity path having a first slope passing through the information memory cells;
   calculating at least a second parity-check symbol from data symbols and parity-check symbols located in the information memory cells and parity-check memory cells, respectively, along a second parity path having a second slope;
   transforming the data symbols and parity-check symbols into Gray symbols, having a minimum distance between adjacent symbols, and thereby generating a Gray symbol sequence;
   transforming the Gray symbol sequence into a modulation symbol sequence, for transmission over a communications channel;
   transmitting the modulation-symbol sequence comprising the data-symbol sequence and the first block of parity-check symbols, over a communications channel having a feedback channel;

demodulating the modulation-symbol sequence into an encoded-data-symbol sequence;

storing the encoded-data-symbol sequence in receiver-memory means having receiver-information-memory cells and receiver-parity-memory cells, wherein said encoded-data-symbol sequence includes a received-parity-check-symbol sequence having received-parity-check symbols stored in the receiver-parity-memory cells, and a receiver-data-symbol sequence blocked and stored in the receiver-information-memory cells;

finding the parity-check symbols and the data symbols along parity lines in receiver-information-memory cells, having an error;

incrementing a count of each composite cell on a composite-error graph traversed by the path of each of the parity lines having an error;

determining the largest-number cell in the composite-error graph having the largest number;

comparing the largest number to a threshold;

changing, provided the largest number exceeds the threshold, the data or parity-check symbol in the receiver-information-memory cells corresponding to the largest-number cell in the composite-error graph having the largest number, thereby the new-data symbol minimizes the count in the largest-number cell;

sending a retransmit request to the transmitter if some errors are not correctable;

sending a second block of parity-check symbols over the communications channel;

using the second set of parity-check symbols, repeating the steps of finding the parity-check symbols and the data or parity-check symbols along the parity lines in said receiver-memory means, having an error;

incrementing the count of each composite cell on a composite-error graph traversed by the path of each of the parity lines having an error;

determining the largest-number cell in the composite-error graph having the largest number;

comparing the largest number to a threshold; and changing, provided the largest number exceeds the threshold, the data or parity-check symbol in the receiver-memory means corresponding to the largest-number cell in the composite-error graph having the largest number, thereby the new-data symbol minimizes the count in the largest-number cell.

18. A PASM error correcting and detecting code encoding apparatus comprising:

memory means coupled to a data source for storing a block of a data-symbol sequence;

processor means coupled to said memory means for calculating a first set of parity-check symbols from the data symbols along a first set of parity lines, wherein each parity line of the first set of parity lines has a path with a first slope traversing through said information-memory cells, and said first set of parity-check symbols forms a first parity row located in said parity-check memory cells, calculating at least a second set of parity-check symbols from the data symbols along a second set of parity lines, wherein each parity line of the second set of parity lines has a path with a second slope traversing through said information-memory cells and through said first parity row, and said second set of parity-check symbols form a second parity row located in said parity-check memory cells, and outputting an encoded-data-symbol sequence comprising the data-symbol sequence and the parity-check symbols;

Gray means for transforming the encoded-data-symbol sequence into a Gray-symbol sequence; and modulation means responsive to the Gray symbol sequence for generating a modulation-symbol sequence.

19. A TASM error correcting and detecting code encoding apparatus comprising:

memory means coupled to a data source for storing a block of a data-symbol sequence having data symbols with p-bits per symbol, in memory means having information memory cells and parity-check memory cells;

processor means for calculating a first set of parity-check symbols from data symbols located in the information memory cells, along a first parity path having a first slope passing through the information memory cells and parity-check memory cells by adding modulo $2^p$ the data symbols and parity-check symbols along the first parity path; storing said first set of parity-check symbols in a first parity row located in said parity-check memory cells; calculating at least a second set of parity-check symbols from data symbols and parity-check symbols located in the information memory cells and parity-check memory cells, respectively, along a second parity path having a second slope by adding modulo $2^p$ the data symbols and parity-check symbols along the second parity path, wherein said second parity-check symbols are located at said second slope with reference to the first parity-check symbols, in a second parity row located in said parity-check memory cells; storing said second parity-check symbols in said second parity row; and outputting an encoded-data-symbol sequence comprising the data-symbol sequence and the parity-check sequence;

Gray means for transforming the encoded-data-symbol sequence into a Gray-symbol sequence; and modulation means responsive to the Gray symbol sequence for generating a modulation-symbol sequence.

* * * * *